United States Patent

Laupman

[15] 3,676,706

[45] July 11, 1972

[54] A.C. CONTROL DEVICES

[72] Inventor: Robert Ronald Laupman, Wijchen, Netherlands

[73] Assignee: N.V. Avco, Wijchen, Netherlands

[22] Filed: Jan. 5, 1971

[21] Appl. No.: 104,011

[30] Foreign Application Priority Data

Jan. 9, 1970 Netherlands ..........................00280/70

[52] U.S. Cl. .........................307/252 B, 307/252 N, 307/293

[51] Int. Cl. .........................................................H03k 17/00

[58] Field of Search ................307/252 B, 252 N, 252 T, 293

[56] References Cited

UNITED STATES PATENTS 3,443,188 5/1969 Mortimer ...........................307/252 B 3,524,997 8/1970 Harnden, Jr. et al. ...............307/252 B 3,526,003 8/1970 Granieri .............................307/252 B 3,553,495 1/1971 Shaugnessy ........................307/252 B

*Primary Examiner*—John Zazworsky
*Attorney*—Diller, Brown, Ramik & Holt

[57] ABSTRACT

A circuit arrangement for controlling an alternating current through a load in response to a direct-current control signal applied to its input terminals is provided with a specific organization of a firing circuit arrangement comprising the three basic transistor circuit configurations. With a suitable dimensioning of the resistors and capacitors associated with the three transistors, a desired voltage waveform is produced serving to fire a semi-conductor switch element through its gate control terminal in dependence on the D.C. control signal applied to the input of said firing circuit arrangement.

7 Claims, 2 Drawing Figures

INVENTOR.
ROBERT RONALD LAUPMAN
BY
Dicke, Browne, Raymond & Hall
ATTORNEYS

A.C. CONTROL DEVICES

This invention relates to an alternating-current control device, including, in series with a load, a semi-conductor switch element with a separate gate electrode for receiving firing pulses issued from a bi-directional switch diode which in turn is connected to firing circuit arrangement, and this to the junction between a resistor and a first capacitor connected in series therewith, which series-circuit is parallel-connected to said semi-conductor switch element; the device further including a compensation capacitor which is connected in series to a pair of parallel-connected circuits, and is included in a circuit which is connected in parallel to said first capacitor, said last-mentioned circuit serving to affect the rate at which said first capacitor is charged, the parallel-connected circuits of said pair being of opposite polarity and each consisting of a series circuit of a diode and a transistor.

An apparatus of this kind is proposed in Dutch patent application 69.17242. By means of this prior proposal, it is possible to realize in an extremely simple manner reliable alternating-current control devices which are highly sensitive to variations of a resistor responsive to a physical magnitude, such as an N.T.C., which is provided across the control input.

The uses of such control devices are limited to a certain extent, it being inherent in these prior proposals that the voltage representative of the actual control magnitude must be an alternating voltage. It is also found that these divices are highly sensitive to spurious pulses introduced from outside, while on the other hand the control action may in turn interfere with other systems.

It is an object of the present invention to eliminate the above disadvantages, and to provide an alternating-current control device which is so arranged that a direct voltage can be used as the control voltage. The aim has further been to keep the design as simple as possible, in the sense that complicated systems with transformers and the like are unnecessary.

The invention is primarily based on the insight that, by virtue of a combination of the three basic transistor circuit arrangements i.e., the grounded emitter configuration, the grounded collector configuration, and the grounded base configuration, the desired direct-voltage-sensitive input can be realized. In the second place it has been found that, owing to a suitable dimensioning of the resistors and capacitors used in such a combination, it is possible to achieve a sharply defined firing moment of the bi-directional switch diode and hence of the semi-conductor switch element, throughout the control range.

Figure 1:
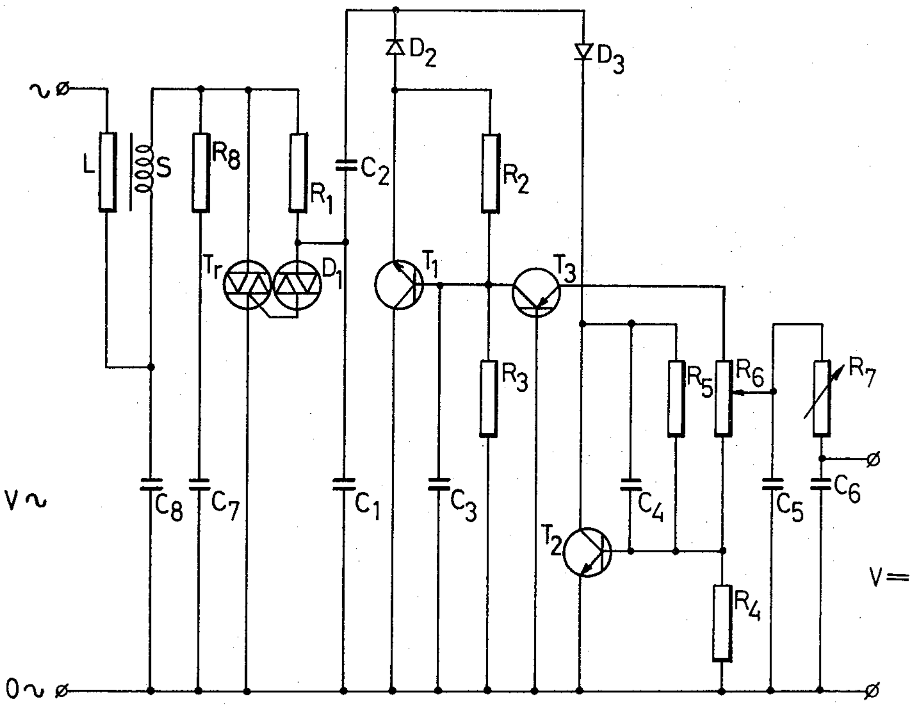
Figure 2:
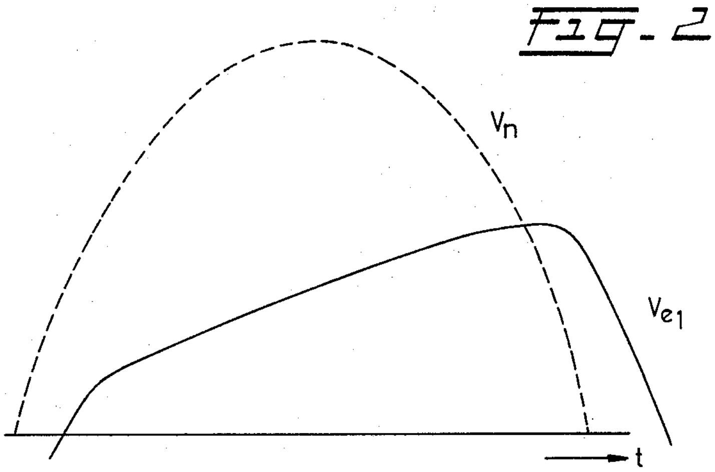

The invention will be further described with reference to the accompanying drawings. In said drawings, FIG. 1 illustrates an embodiment according to the invention in diagram form;

FIG. 2 shows a graph illustrating the voltage configuration across the capacitor in the apparatus of FIG. 1.

Referring to the drawings, a load L is connected to the mains through an A.C. semi-conductor switch triode, such as a triac T*r*. To suppress radio interference, conventional means, such as a choke coil S and a capacitor $C_8$ are included. For attenuating this filter and to prevent oscillations, a likewise conventional RC member $R_8C_7$ is included in parallel with triac T*r*. Connected in parallel to triac T*r* is a series circuit of a resistor $R_1$ and a capacitor $C_1$. The node of resistor $R_1$ and capacitor $C_1$ is connected through an AC semi-conductor switch diode $D_1$, such as a diac, to the gate of triac Tr. Connected in parallel with capacitor $C_1$ is a series circuit consisting of a capacitor $C_2$ and a circuit to be indicated as a control element.

The operation of the circuit arrangement as described above is described in Dutch patent application 69.17242. The control element referred to comprises a pair of parallel-connected branches, each consisting of a transistor $T_1$ and $T_2$, respectively, and a diode $D_1$, $D_3$, respectively, connected in series therewith, one transistor $T_1$ being included in a grounded collector configuration, and the other transistor $T_2$ in a grounded emitter configuration. The arrangement is such that the two branches are of opposite polarity. Both transistors $T_1$ and $T_2$ are provided with respective base emitter resistors $R_2$ and $R_4$, base collector resistors $R_3$ and $R_5$, and base collector capacitors $C_3$ and $C_4$.

The base of $T_1$ is connected to the collector of a third transistor $T_3$, included in grounded base configuration.

The base of $T_2$ and the emitter of $T_3$ are connected to each other through a resistor $R_6$.

The tap of resistor $R_6$, the latter being formed as a voltage divider, is connected through a filter constituted by capacitors $C_5$ and $C_6$ and a variable resistor $R_7$ to one input terminal of a D.C. control voltage source.

By a suitable dimensioning of resistors $R_2$, $R_3$, $R_4$ and $R_5$ and capacitors $C_3$, $C_4$, the voltage wave form across capacitor $C_1$ will become as shown in FIG. 2, the amplitude being affected by the degree of excitation of transistors $T_1$ and $T_2$, whereby the firing moment of $D_1$ is shifted.

By variation of $R_6$, it is possible to adjust the symmetry of the two branches, or if so desired, the degree of asymmetry.

This means that, irrespective of the given asymmetry for alternating voltages or currents in $D_1$, triac T*r* and the pair of parallel branches, an alternating voltage with an entirely symmetrical duty cycle can be presented to load L, which, especially with inductive loads, is often desirable.

The sensitiveness of the control input can be adjusted by means of variable resistor $R_7$, while capacitors $C_5$ and $C_6$ fully protect the control input from spurious pulses and the like.

I claim:

1. An alternating-current control device including a semi-conductor switch element (T*r*) having a plurality of terminals including a pair of load terminals connected in series relationship with a load across a pair of A.C. power supply terminals and a gate control terminal connected to one terminal of a bilateral switching diode ($D_1$) for receiving firing pulses issued therefrom, said diode ($D_1$) having a second terminal connected to a firing circuit arrangement, more particularly to the junction between a resistor ($R_1$) and a first capacitor ($C_1$) connected in series therewith, which series-circuit is parallel-connected to said semi-conductor switch element, said control device further including a compensation capacitor ($C_2$) connected in series to a pair of parallel-connected circuits and included in a circuit connected in parallel to said first capacitor ($C_1$), said last-mentioned circuit serving to affect the rate at which said first capacitor ($C_1$) is charged, said parallel-connected circuits being of opposite polarity and each including a series circuit of a diode ($D_2$) and ($D_3$), respectively, and first transistors ($T_1$) and ($T_2$), respectively, characterized in that one of said transistors ($T_2$) is included in a grounded emitter circuit configuration, the other of said first transistors ($T_1$) being included in a grounded collector circuit configuration and being controlled by a third transistor ($T_3$) included in a grounded base circuit configuration, the base of said one first transistor ($T_2$) and the emitter of said third transistor ($T_3$) being connected through a resistor to one of a pair of D.C. control voltage input terminals, and that both said first transistors ($T_2$) and ($T_1$) are respectively provided with base emitter resistors ($R_4$), ($R_2$), base collector resistors ($R_5$), ($R_3$), and base collector capacitors ($C_4$), ($C_3$), the arrangement being so dimensioned that the voltage developed across said first capacitor ($C_1$) increases gradually over a range corresponding with a virtually complete half-excursion of the A.C. power voltage applied to said pair of A.C. power supply terminals, the amplitude of said voltage being determined by the magnitude of D.C. control voltage applied across said D.C. control voltage input terminals.

2. Apparatus according to claim 1, characterized in that said base input resistor of said one first transistor ($T_2$) and the emitter input resistor of said third transistor ($T_3$) are formed as a potentiometer ($R_6$) having a tap connected to said one control voltage input terminal.

3. Apparatus according to claim 2, characterized in that a variable resistor $R_7$ is connected in series with said one control voltage input terminal.

4. Apparatus according to claim 3, wherein a capacitor ($C_6$) is connected across said control voltage input terminals, and a capacitor ($C_5$) is connected between said potentiometer tap and the other of said control voltage input terminals.

5. Apparatus according to claim 1, characterized in that a variable resistor ($R_7$) is connected in series with said one control voltage input terminal.

6. Apparatus according to claim 2, wherein a capacitor ($C_6$) is connected across said control voltage input terminals, and a capacitor ($C_5$) is connected between said potentiometer tap and the other of said control voltage input terminals.

7. Apparatus according to claim 1, wherein a capacitor ($C_6$) is connected across said control voltage input terminals.

* * * * *

PO-1050
(5/69)

UNITED STATES PATENT OFFICE
CERTIFICATE OF CORRECTION

Patent No. 3,676,706 Dated July 11, 1972

Inventor(s) ROBERT RONALD LAUPMAN

It is certified that error appears in the above-identified patent and that said Letters Patent are hereby corrected as shown below:

On the Abstract page, read the assignee as -- N. V. Auco, Wijchen, Netherlands --

Signed and sealed this 23rd day of January 1973.

(SEAL)
Attest;

EDWARD M.FLETCHER,JR.
Attesting Officer

ROBERT GOTTSCHALK
Commissioner of Patents